(12) United States Patent
Ohkubo et al.

(10) Patent No.: US 6,618,417 B2
(45) Date of Patent: Sep. 9, 2003

(54) RIDGE WAVEGUIDE SEMICONDUCTOR LASER DIODE

(75) Inventors: Michio Ohkubo, Tokyo (JP); Yoshikazu Ikegami, Tokyo (JP); Takeshi Namegaya, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/872,334

(22) Filed: Jun. 1, 2001

(65) Prior Publication Data

US 2002/0024984 A1 Feb. 28, 2002

Related U.S. Application Data

(63) Continuation-in-part of application No. 09/201,245, filed on Nov. 30, 1998.

(51) Int. Cl.[7] ................................................. H01S 5/00
(52) U.S. Cl. .................................................. 372/46; 372/45
(58) Field of Search ........................................ 372/46, 45

(56) References Cited

U.S. PATENT DOCUMENTS 5,394,424 A   2/1995  Ijichi et al. .................... 372/46

FOREIGN PATENT DOCUMENTS

| JP | 6-037389  | 2/1994  | ............. H01S/3/18 |
| JP | 6-188513  | 7/1994  | ............. H01S/3/18 |
| JP | 7-030199  | 1/1995  | ............. H01S/3/18 |
| JP | 7-283484  | 10/1995 | ............. H01S/3/18 |

*Primary Examiner*—Quyen Leung
(74) *Attorney, Agent, or Firm*—Sheppard Mullin Richter & Hampton LLP

(57) ABSTRACT

A GaAs based semiconductor laser has a combination of cladding layers including a ridge structure part, and a remaining part which overlays the active layers of the laser, and an etch stop layer sandwiched between the ridge structure part and the remaining part. The remaining part preferably overlies the entire surface of laser active layers and has a thickness "D" which satisfies $1.1 \times W > D \geq 0.5 \times W$ wherein W is the width of a spot size having a strength of +e,fra $1/e^2$+ee as measured at the laser front facet in a direction perpendicular to the active layers, wherein "e" is the base of the natural logarithm. The semiconductor laser solves the kink phenomenon to obtain an excellent linear relationship between the optical output power and the injected current.

19 Claims, 5 Drawing Sheets

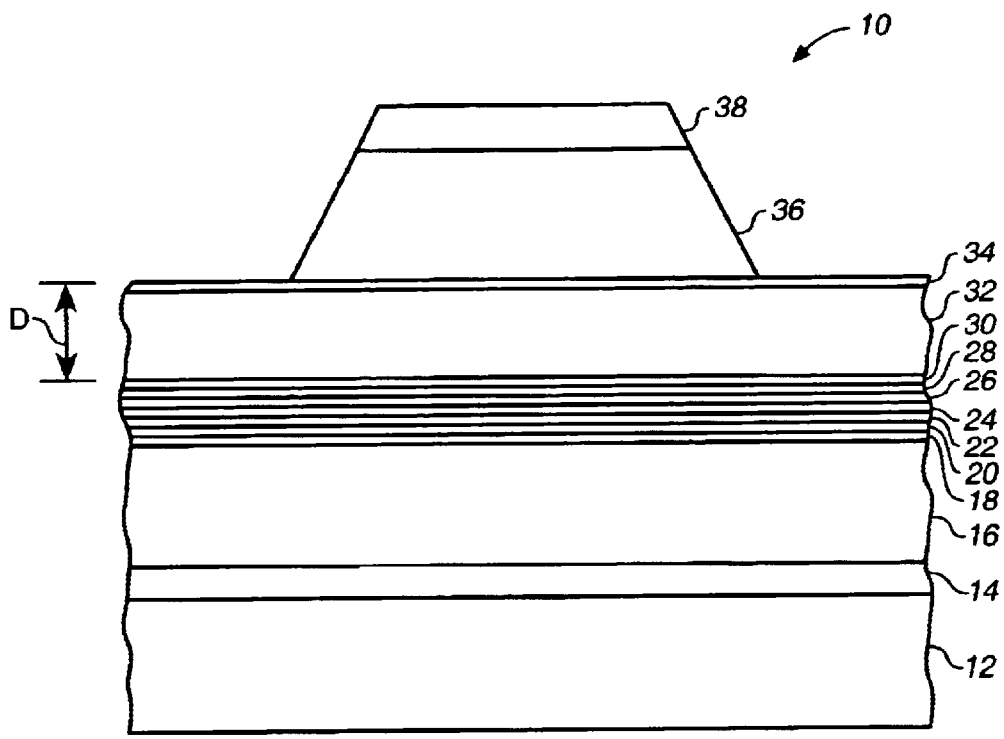
FIG._1
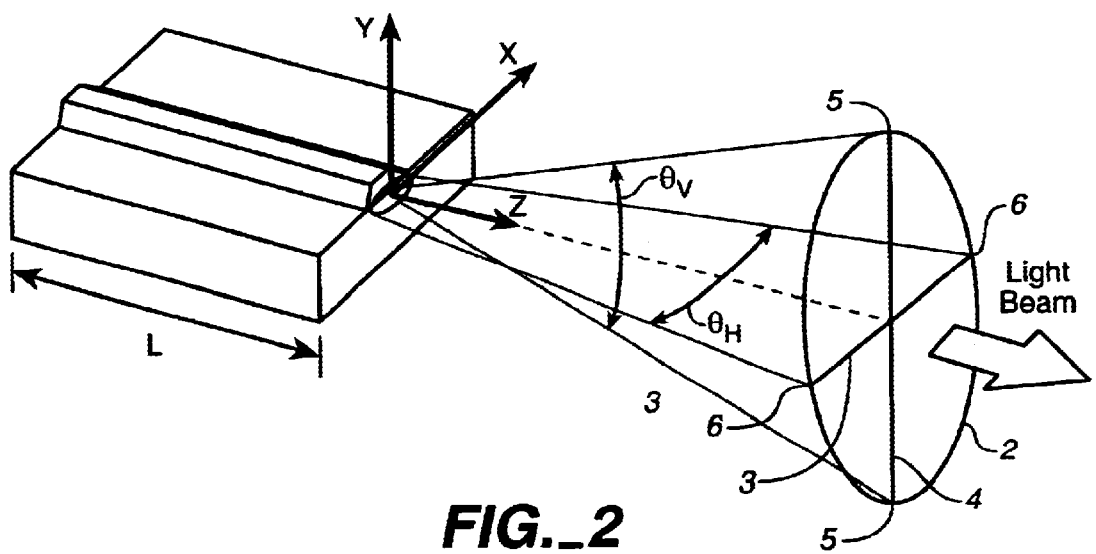
FIG._2

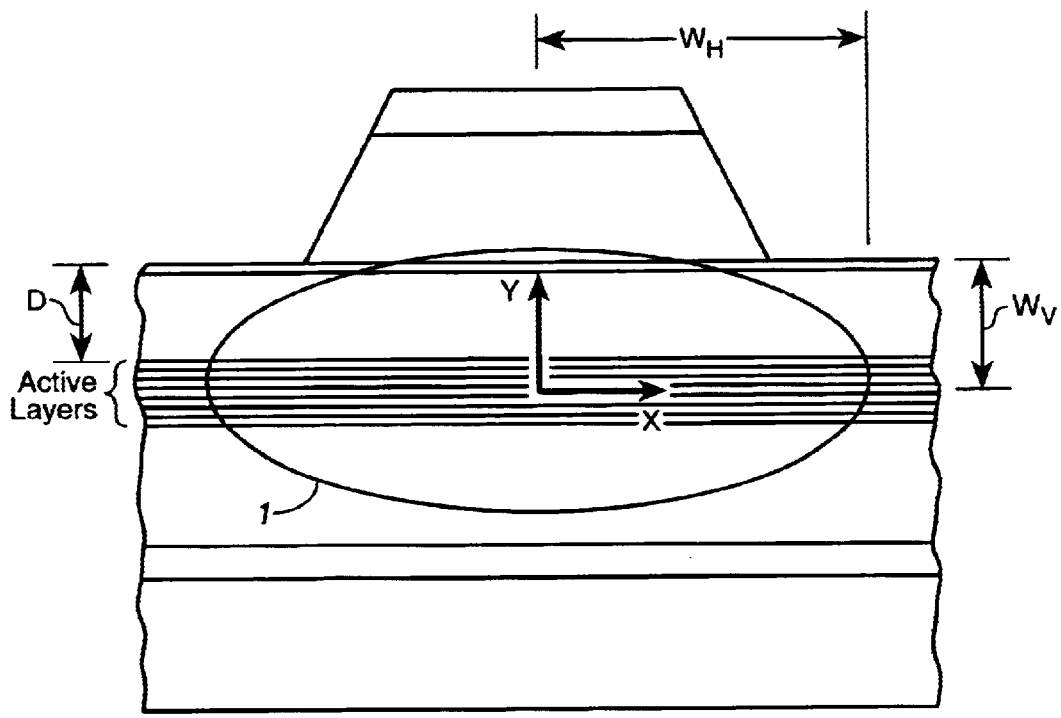
*FIG._3*
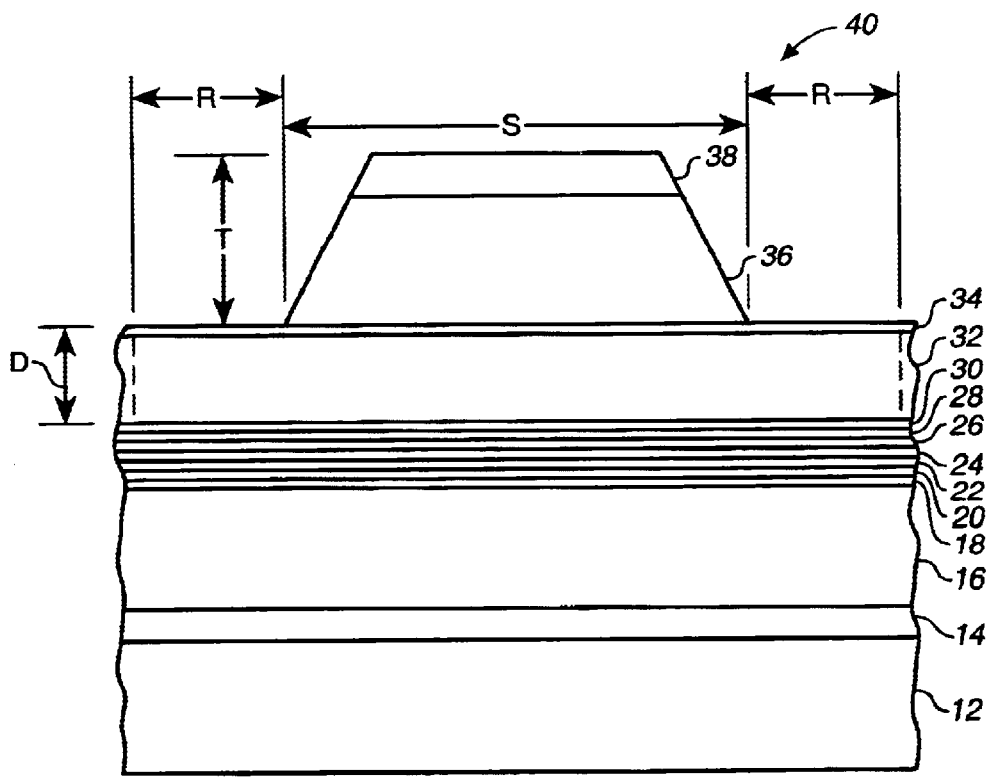
*FIG._4*

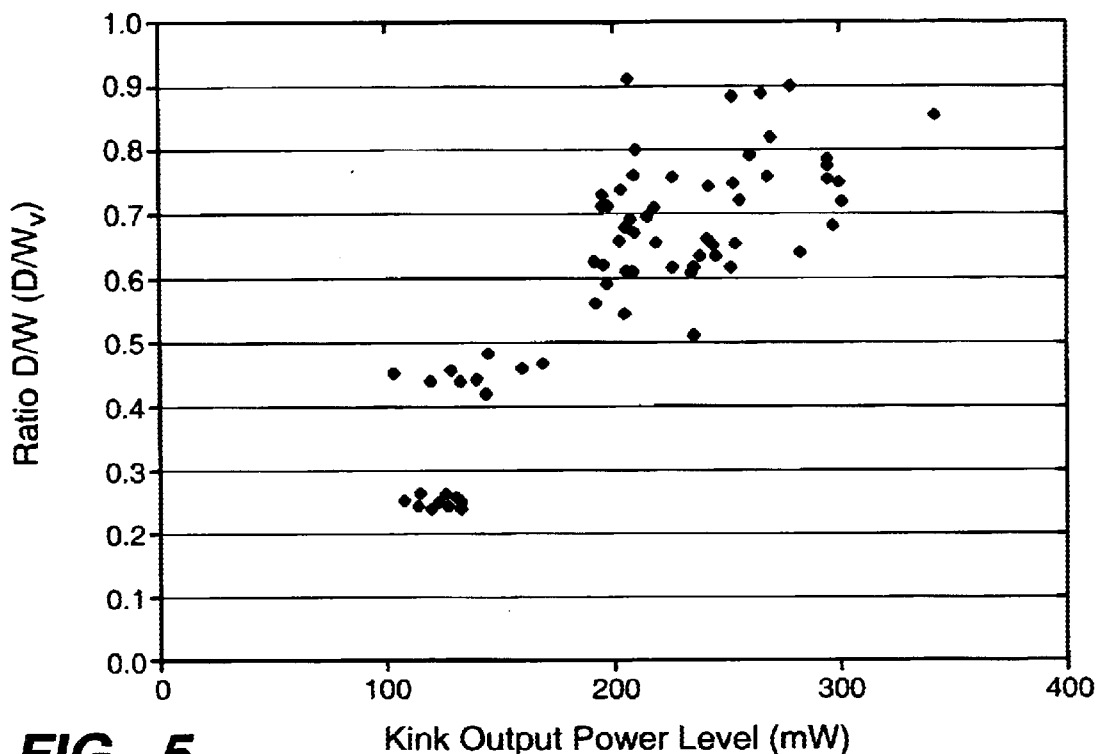
FIG._5
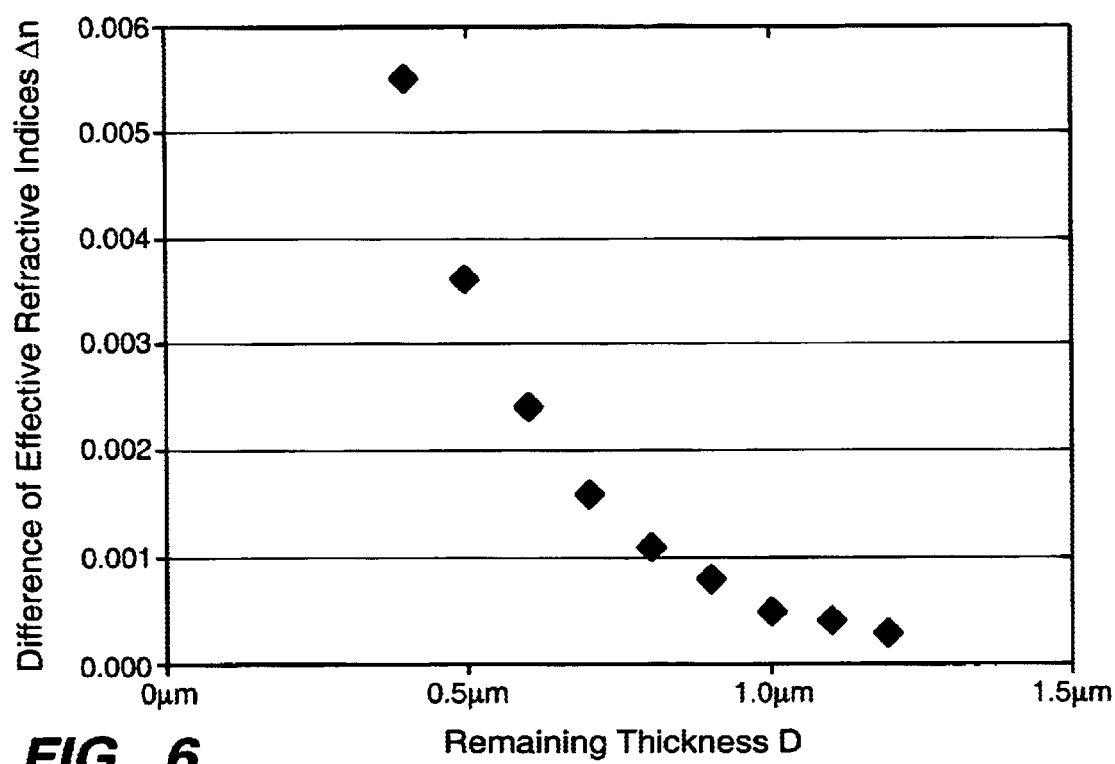
FIG._6

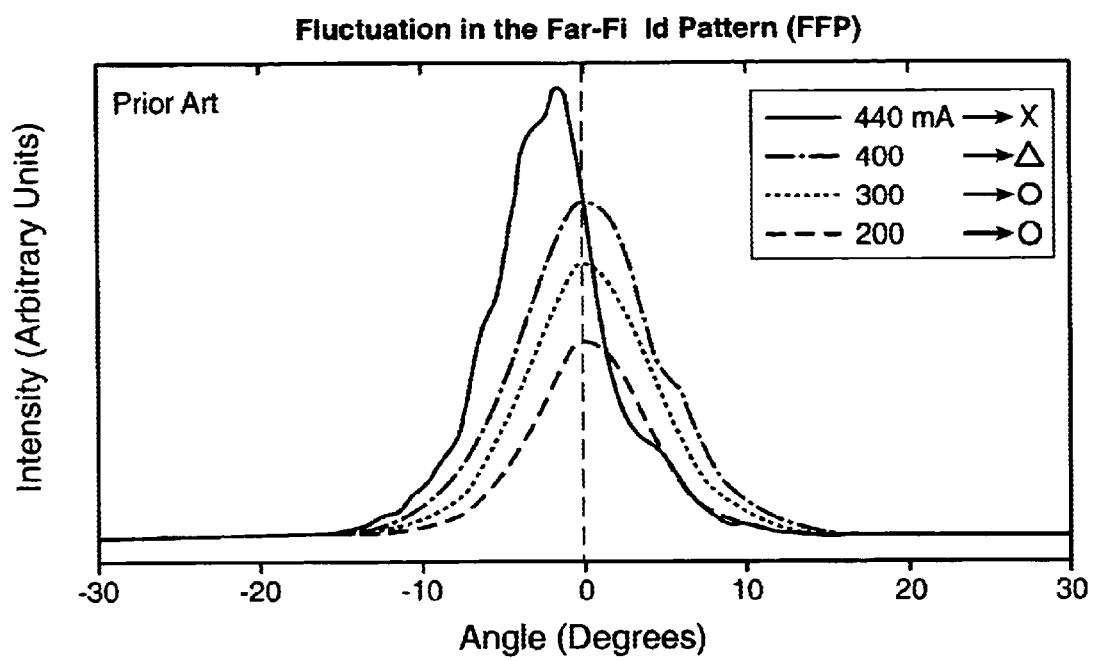
FIG._7
*(PRIOR ART)*
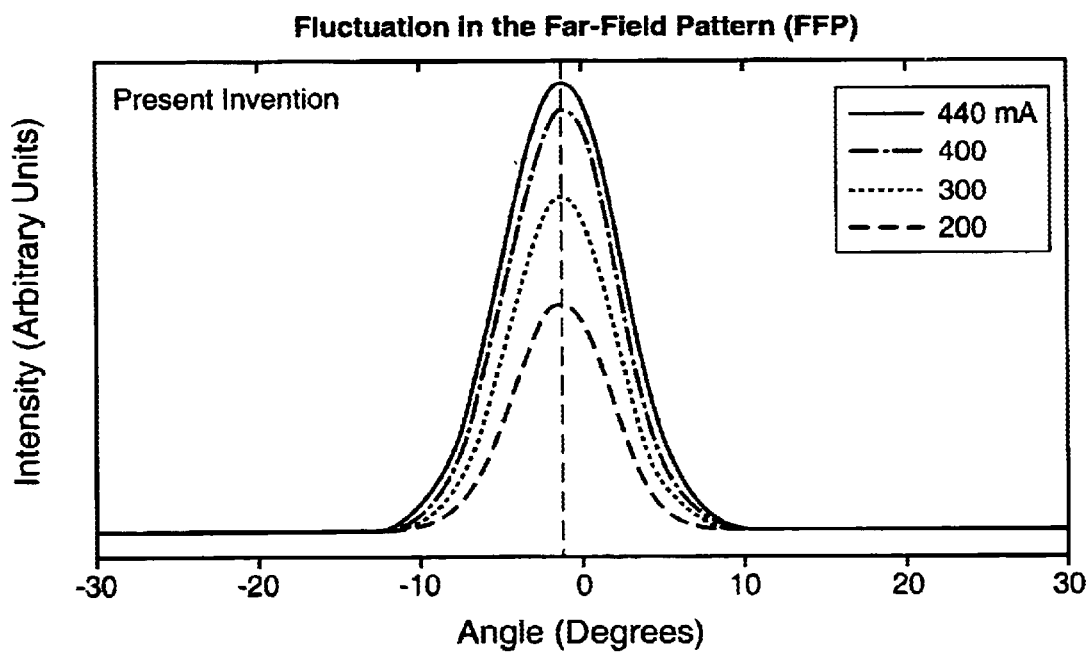
FIG._8

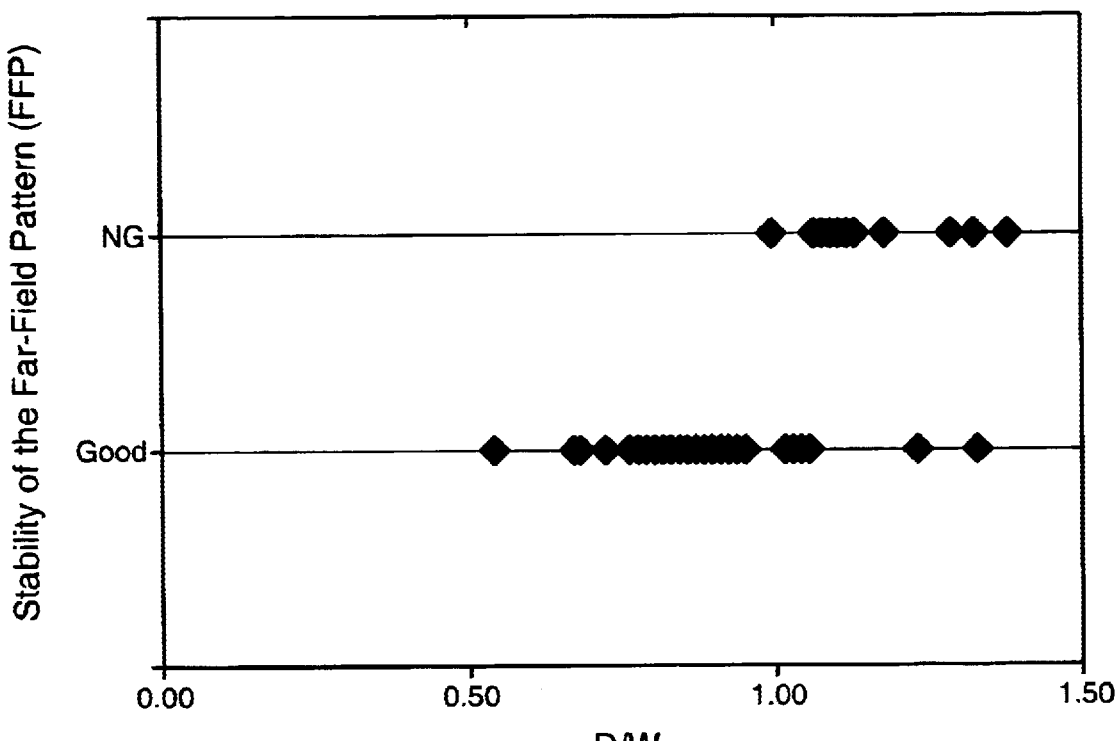
FIG._9
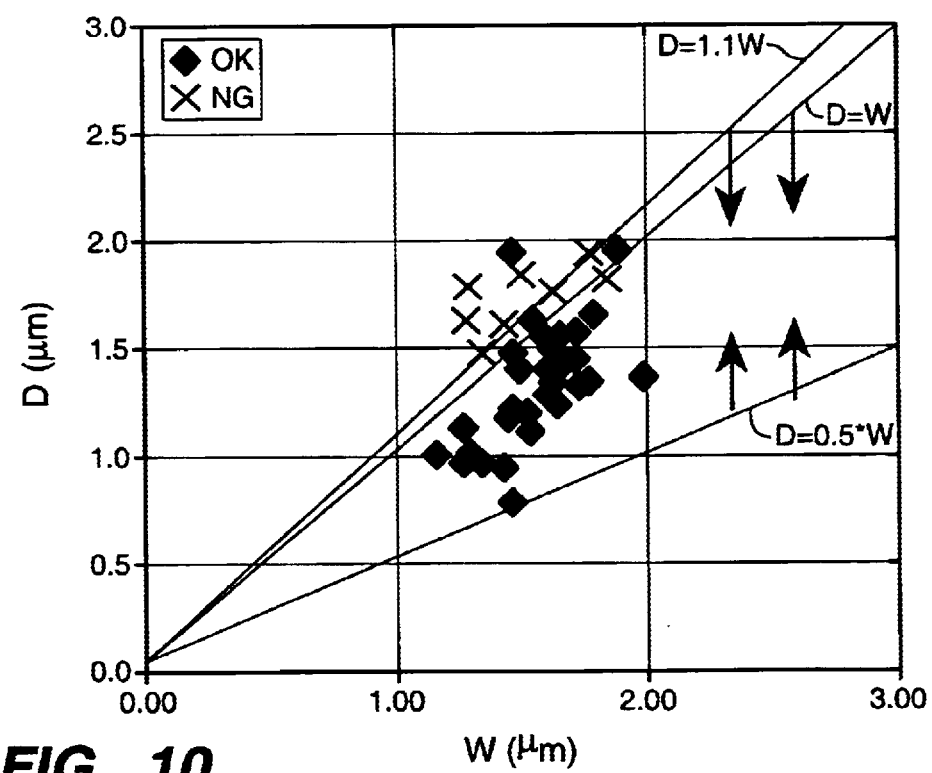
FIG._10

RIDGE WAVEGUIDE SEMICONDUCTOR LASER DIODE

RELATED APPLICATIONS

This application is a continuation-in-part of U.S. patent application Ser. No. 09/201,245, filed Nov. 30, 1998, the contents of which are incorporated herein by reference.

FIELD OF THE INVENTION

The present invention relates to a ridge waveguide semiconductor laser diode, and more particularly, to a ridge waveguide semiconductor laser diode having a high output power and an excellent laser characteristic and capable of operating at a higher output power with excellent stability.

BACKGROUND OF THE INVENTION

GaAs-based quantum-well laser diodes each having an InGaAs strained quantum-well active layer or layers, especially ridge waveguide semiconductor laser diodes, have been intensively researched and developed as feasible higher-output power semiconductor laser diodes or light sources in optical devices for use in wavelength division multiplexing (WDM) systems. With the development of WDM systems, it is desired to further increase the optical output power of the ridge waveguide semiconductor laser diode.

In addition, the GaAs based ridge waveguide semiconductor laser diode attracts attention as a light source for use in an erbium-doped fiber amplifier (EDFA).

Referring to FIG. 1, a typical GaAs-based quantum-well laser diode will be described as an example. A layer structure 10 of a conventional ridge waveguide GaAs laser diode includes, for instance, a buffer layer 14 having GaAs or AlGaAs based compound semiconductor layer, a lower cladding layer 16, a first optical confinement layer 18, a second optical confinement layer 20, a first strained quantum-well layer 22, a barrier layer 24, a second strained quantum-well layer 26, a third optical confinement layer 28, a fourth optical confinement layer 30, a first upper cladding layer 32, an etch stop layer 34, a second upper cladding layer 36, and a cap layer 38 consecutively formed on a n-GaAs substrate 12. The second upper cladding layer 36 and the cap layer 38 overlying the etch stop layer 34 have a mesa structure. The quantum-well layers 22,26, the barrier layer 24, and optical confinement layers 18,20,28,30 are oftentimes referred to as the active layers.

The chief factor for restricting the increase of the optical output power from the GaAs based ridge waveguide quantum-well laser diode (hereinafter referred to as simply GaAs quantum-well laser diode) is catastrophic optical damage (COD) which signifies that the optical facet of the laser diode is damaged instantaneously. When the optical output power increases to reach a specific value, the COD which is inherent in the GaAs based laser diode is generated to stop the function of the laser diode at that instant.

For preventing the generation of COD failure, for instance, a conventional wide mesa structure of about 4 $\mu$m is adopted to decrease the optical density in the active layers: however, in case of the wide mesa structure, a so-called spatial-hole-burning phenomenon occurs wherein the optical gain of the laser diode is uneven in the direction parallel to the axis of the active layers arises to thereby tend to generate a beam steering phenomenon.

The beam steering phenomenon is known in the art and it means that the light beam moves in the direction parallel to the active layers (as viewed from the front facet of the laser), which causes the characteristic of the optical output with respect to injected current in the semiconductor laser diode to be non-linear by having one or more kinks in the characteristic, thereby deteriorating the laser characteristic significantly. The non-linearity means that the external differential quantum efficiency "$\eta$"($\eta = dL_{OUT}/d(I - I_{TH})$) does not remain as a constant, wherein "$L_{OUT}$" represents the optical output, "I" represents the injected current at the optical output of "$L_{OUT}$", and "$I_{TH}$" represents a threshold current. In a more extreme case, "$\eta$" sometimes becomes almost 0. Accordingly, signal conversion cannot be effected from the injected current due to the deteriorated laser characteristic. This is particularly critical when the laser diode is coupled to an optical fiber.

For preventing the generation of the problem beam steering phenomenon in a high output power range, it is necessary to consider complicated and various effects, such as the waveguide mode control of the active layers, and thus the problem is not solved in the conventional GaAs quantum-well laser diode.

In addition, it is important to obtain an operational stability in the laser diode's output at a higher output power levels, especially in the stability of the transverse and longitudinal modes of the diode when one uses a GaAs-based quantum-well laser diode as a light source for a WDM system.

As another application, a new optical module wherein a GaAs-based quantum-well laser diode and a fiber Bragg grating (FBG) for controlling the lasing wavelength and gain of the diode are integrated together is now being put to practical use as the pumping light source for erbium-doped fiber amplifiers (EDFAs). However, if a GaAs-based quantum-well laser diode having a lasing wavelength of 980 nm is used as a light source for an EDFA, the longitudinal mode operation is unstable when light returns from the FBG, whereby the optical output power fluctuates to cause another problem.

In the above description for the problems in the ridge waveguide semiconductor laser diodes, a GaAs-based quantum-well laser diode is exemplified. However, these problems are not peculiar to the GaAs-based quantum-well laser diode, but are common to general ridge waveguide semiconductor laser diodes.

SUMMARY OF THE INVENTION

It is therefore an object of the present invention to provide a ridge waveguide semiconductor laser diode having a linear characteristic between the optical output power and the injected current in a higher optical output range.

It is another object of the present invention to provide a ridge waveguide semiconductor laser diode which is capable of operating with excellent stability in both of its transverse and longitudinal modes.

It is still another object of the present invention to provide a ridge waveguide semiconductor laser diode which is capable of operating with a FBG in a stable manner to provide a stable light source for the EDFA.

The present invention provides a ridge waveguide semiconductor laser diode including a semiconductor substrate, at least one active layer overlying the semiconductor substrate, and at least one cladding layer overlaying the at least one active layer. The at least one cladding layer includes a ridge structure part having a length L along the direction of light propagation, a width S which is perpendicular to the length L and parallel to the surface of the at least one active layer, and a thickness T which is perpendicular to the width and the length. The at least one cladding layer further includes a remaining part which is a sub-layer disposed between the ridge structure part and the at least one active layer. The remaining part overlies at least the portions of the active layer(s) which are within a relatively short distance either side of the ridge structure part. This relatively short distance is typically around a value of $2 \cdot W_H$, where "$W_H$" is the horizontal width of the laser spot emanating from the laser diode's front facet, as measured at the front facet and as measured in the direction which is parallel with the plane of the active layers (as viewed from the front facet). However, in some preferred embodiments of the present invention, the remaining part of the cladding layer(s) overlies substantially the entire surface of the active layer(s).

For applications where the laser diode is not used with an FBG, or other type of wavelength selector, positioned in front of diode's emitting facet, the remaining part has a thickness "D" in the range of:

$$D \geq \tfrac{1}{2} W,$$

wherein "W" is the width of the laser spot emanating from the laser diode's front facet, as measured at the front facet and as measured in the direction which is perpendicular to the plane of the active layers (as viewed from the front facet). The width is measured at the points of the spot where the light power level has a value which is $1/e+hu\ 2$ of the maximum power level at the center of the spot, with "e" being the base of the natural logarithm (e=2.71828. . . ). In practice, and as described below in greater detail, the width of the spot can be readily measured from the vertical divergence angle in the laser's far-field pattern (the latter of which is a projection of the laser spot onto a planar surface spaced at a distance from the laser diode's front facet, and parallel thereto).

For applications where the laser diode is used with an FBG, or other type of wavelength selector, positioned in front of diode's emitting facet, the remaining part has a thickness "D" within the range of:

$$1.10 \times W > D \geq \tfrac{1}{2} W,$$

and more preferably within the range of:

$$1.05 \times W > D \geq \tfrac{1}{2} W,$$

and most preferably within the range of:

$$W > D \geq \tfrac{1}{2} W.$$

In accordance with the semiconductor laser diode of the present invention, due to the value for "D", the kink phenomenon in the characteristic of the optical output power with respect to injected current caused by a beam steering phenomenon can be improved, as a result of which an excellent linear characteristic can be obtained in a higher output power range, whereby the ridge waveguide semiconductor laser diode can operate with excellent stability in the transverse and longitudinal modes. In addition, the potential for COD failure is significantly reduced.

If an FBG is positioned at the front facet of a GaAs-based quantum well laser diode according to the present invention, the GaAs quantum well laser diode operates in a stable output power, and can be used to construct an EDFA having excellent operational characteristics.

The above and other objects, features and advantages of the present invention will be more apparent from the following description, referring to the accompanying drawings.

BRIEF DESCRIPTION OF THE DRAWINGS

FIG. 1 is a sectional view of a typical ridge waveguide semiconductor laser diode according to the prior art.

FIG. 2 is a perspective view of a ridge waveguide and its far-field pattern according to the present invention.

FIG. 3 is a front view of the of the laser diode according to the present invention showing the extent of the light beam generated by the laser.

FIG. 4 is a sectional view of a ridge waveguide semiconductor laser diode according to an embodiment of the present invention.

FIG. 5 is a graph showing relationship between the kink output power and the ratio D/W according to an embodiment of the present invention.

FIG. 6 is a graph of the difference between the effective refractive index of the mesa structure and the effective refractive index of the remaining cladding layer according to the present invention.

FIG. 7 is a graph of the light intensity of the far-field pattern along the horizontal axis for a ridge waveguide laser according to the prior art operated at selected drive current levels.

FIG. 8 is a graph of the light intensity of the far-field pattern along the horizontal axis for a ridge waveguide laser according to the present invention operated at selected drive current levels.

FIG. 9 is a first graph of experimental results of experiments according to the present invention.

FIG. 10 is a second graph of experimental results of experiments according to the present invention.

DETAILED DESCRIPTION OF THE INVENTION

In discussing the present invention, it will be convenient to define some coordinate axes and some terminology. Referring to FIG. 2, we will use a conventional three-dimensional Cartesian coordinate system with three axes: X, Y, and Z. Without loss of generality, we will orient the length of the laser diode cavity to be parallel to the Z-axis, and the plane of the active layers to be parallel to the X-and Z-axes so that the Y-axis will be normal to the surfaces of the active layers. Again, without loss of generality, we place the front facet of the laser diode at (X,Y,Z)=(0,0,0), and the back (highly reflective) facet at (X,Y,Z)=(0,0,-L), where L is the length of the laser cavity. Within the laser structure, the light propagates parallel to the Z-axis, and along the length of the laser cavity. The Z-axis will sometimes be referred to as the "longitudinal axis," and the modes of the light along this axis will be referred to as "longitudinal modes." Both the X-and Y-axes will sometimes be referred to as the "transverse axes" since they are transverse to the direction of light propagation, with the X-axis being called the "horizontal transverse axis" or the "parallel transverse axis," and the Y-axis being called the "vertical transverse axis" or the "perpendicular transverse axis." The modes of the light along these axes will be referred to as "transverse modes," as is conventional in the art.

The laser is preferably operated within the fundamental transverse mode, which appears as an oval spot of light at the front facet. FIG. 3 is a front view of the front facet of the laser diode showing the oval spot at reference number 1. Oval spot 1 has horizontal width $W_H$ as measured along the X-axis, and a vertical width $W_v$ as measured along the Y-axis. For the purposes of making these width measurements, the peripheral edge of the spot is defined as the locus of points of the spot where the light power level has a value which is $1/e_{+hu\,2}$ of the maximum power level at the center of the spot, with "e" being the base of the natural logarithm (e=2.71828...).

In practice, the width of the spot is usually measured by projecting the laser spot onto a planar surface spaced at a distance from the laser diode's front facet, and parallel thereto, to form an enlarged version of the spot (e.g., to form a near field pattern). The enlarged spot version is shown at 2 in FIG. 2. The enlarged spot version has the shape of an oval having two axes, a parallel axis 3 which is parallel to the plane of the active layers, and a perpendicular axis 4 which is perpendicular to the plane of the active layers. Because of optical diffraction effects, the width of the spot along perpendicular axis 4 is larger than the width of the spot along parallel axis 3, which is opposite to case shown in FIG. 3 where the horizontal spot width $W_H$ is larger than the spot vertical width $W_V$. (When the dimensions of a laser spot are near the wavelength of the emitted laser light, which is most often the case, diffraction effects cause the light emitted from the smaller spot width to spread out with a greater diffraction angle than the light emitted from the larger spot width.) For deriving the value of $W_V$ from the far field pattern, one first finds the two points along perpendicular axis 4 where the optical power is one-half ($1/2$) of the maximum optical power at the spot center. These two points are located on either side of the spot center, and are indicated in FIG. 2 by the reference numbers 5. The angle formed between the center of the front facet of the laser diode and each of the two points 5 of the enlarged version defines the full angle $\theta_V$ of the vertical far-field pattern. This angle is measured by means well known to the art. The vertical spot width $W_V$ may be found from the angle $\theta_V$ and the wavelength $\lambda$ of the emitted light from the following relationship (and its equivalents):

$$W_V = \frac{\lambda}{\pi \cdot \tan\left(\frac{\theta_V}{\sqrt{2 \cdot \ln 2}}\right)}, \quad [1]$$

where "ln 2" is the natural logarithm of 2, where "tan" is the tangent function, and where $\theta_V$ is provided in the dimensions of radians.

In a similar manner, for deriving the value of $W_H$ from the far field pattern, the points of one-half maximum power are found on the parallel axis 3 of the enlarged spot version, as indicated at reference numbers 6. The angle formed between the front facet of the laser diode and each of the two points 6 defines the full angle $\theta_H$ of the horizontal far-field pattern. This angle is measured by means well known to the art. An analog of the above formula may then be used to derive $W_H$ from $\theta_H$ and $\lambda$ as follows:

$$W_H = \frac{\lambda}{\pi \cdot \tan\left(\frac{\theta_H}{\sqrt{2 \cdot \ln 2}}\right)}. \quad [2]$$

The inventors studied the measures for maintaining the linear relationship between the optical output power and the injected current to prevent the kink phenomenon. From their studies, the inventors discovered that the optical density in the active layers was inversely proportional to the product of the horizontal width $W_H$ and the vertical width $W_V$ of the optical spot, and that the size of these widths (i.e., the size of the transverse confinement) could be controlled based on the remaining thickness D of the cladding layers overlying the entire surface of the active layers. The remaining thickness "D" as used herein is represented by the thickness of a remaining part of the cladding layers underlying the ridge structure part of the cladding layers. That is, the remaining thickness D is represented in FIG. 4 by the overall thickness of the remaining part the layer structure, including the first upper cladding layer 36 and the etch stop layer 34. The remaining thickness D is also indicated in FIG. 3.

In addition to the above findings, the inventors considered that, in the case of a ridge waveguide semiconductor laser diode having a wide mesa structure for reducing the optical density therein, the beam steering phenomenon does not arise in the high optical output power range, thereby maintaining a constant value for the external differential quantum efficiency η, if a specific relationship holds between the vertical spot width $W_V$ and the remaining thickness D of the cladding layers. As the vertical spot width $W_V$ is important in describing the present invention, we will simplify its notation to "W" in the following discussion.

The inventors then studied the effects of the above width W and thickness D on what the inventor call the laser's "kink output power level." The kink output power level is the optical output power of the laser at which a significant "kink" first occurs in the normally smooth, linear or quasi-linear relationship between the laser's optical output current $L_{OUT}$ and the laser's drive current I. As indicated above, the slope of the relationship of $L_{OUT}$ versus I is the external differential quantum efficiency "η" (η=$dL_{OUT}/d(I-I_{TH})$), which normally has a nearly constant value for drive current I above threshold $I_{TH}$, or has a curve which quickly reaches an maximum value $\eta_{MAX}$ for a value of I just above $I_{TH}$ and thereafter decreases gradually as I is increased. A significant kink can be defined as occurring when η undergoes an abrupt decrease of 20%, followed by a rebounding back to near its prior level, when the drive current is changed by a relatively small amount. A significant kink can also be defined as occurring when η falls to a value of 80% of $\eta_{MAX}$ as the current is increased beyond the point where $\eta_{MAX}$ is initially reached. We have used both definitions herein (in other words, if either of the above two conditions occurs, we have counted a kink as having occurred).

Now, the present invention is described more specifically based on a preferred embodiment thereof with reference to the accompanying drawings.

An epitaxial growth was conducted to form compound semiconductor layers on an n-GaAs substrate 12 by using a Metal Organic Chemical deposition (MOCVD) method to fabricate a layer structure 10 of the GaAs-based semiconductor laser diode shown in FIG. 4. The layer structure include the following consecutively formed layers, starting with the bottom layer:

| | |
|---|---|
| buffer layer 14: | n-GaAs layer, |
| lower cladding layer 16: | n-$Al_{0.3}Ga_{0.7}As$ layer, |
| first optical confinement layer 18: | $Al_{0.2}Ga_{0.8}As$ layer, |
| second optical confinement layer 20: | $GaAs_{0.94}P_{0.06}$ layer, |
| first strained quantum well layer 22: | $In_{0.2}Ga_{0.8}As$ layer, |
| barrier layer 24: | $GaAs_{0.94}P_{0.06}$ layer, |
| second strained quantum well layer 26: | $In_{0.2}Ga_{0.8}As$ layer, |
| third optical confinement layer 28: | $GaAs_{0.94}P_{0.06}$ layer, |
| fourth optical confinement layer 30: | $Al_{0.2}Ga_{0.8}As$ layer, |
| first upper cladding layer 32: | p-$Al_{0.3}Ga_{0.7}As$ layer, |
| etch stop layer 34: | p-$In_{0.5}Ga_{0.5}P$ layer, |
| second upper cladding layer 36: | p-$Al_{0.3}Ga_{0.7}As$ layer, |
| cap layer 38: | p-GaAs layer. |

Subsequently, a SiN film was formed on the cap layer 38, and used as a mask for etching the second upper cladding layer 36 by a wet etching process using citric acid. The etching process was stopped by the etch stop layer 34, thereby defining the second cladding layer 36 in the shape of a mesa structure, preferably having a width of 4 μm.

Then, a second SiN film was formed over the entire surface including the mesa structure. The second SiN film was removed from the surface of the cap layer 38 to expose the cap layer 38. A p-electrode was formed on the exposed cap layer 38, and an n-electrode was formed on the bottom surface of the substrate 12.

Thereafter, the bulk device was cleaved to form a laser diode cavity of a desired length, and a dielectric film having a reflectivity of 10% was formed by coating on the front facet (i.e., the low-reflection facet) of the laser structure and another dielectric film having a reflectance of 95% was formed on the back facet (i.e., the high-reflection facet), to complete a semiconductor laser diode. In this manner, the active layers and cladding layers are disposed between the front and back facets. The mesa structure of the second upper cladding layer 36 has a first ridge side disposed between the front and back facets, a second ridge side disposed between the front and back facets, a width S between the first and second ridge sides, and thickness T. The remaining part of the cladding layers (layers 32 and 34) has a first portion underlying the mesa (i.e., the ridge structure part), a second portion which extends away from the mesa by at least a distance R from the first ridge side, and a third portion which extends away from the mesa by at least distance R from the second ridge side, where the distance R is shown in FIG. 4. The distance R typically has a value of $2 \cdot W_H$, or more over. Usually, the remaining part of the cladding layer(s) overlies substantially the entire surface of the active layer(s).

For fabricating the sample semiconductor laser diodes, the thicknesses of first optical confinement layer 18, second optical confinement layer 20, third optical confinement layer 28, fourth optical confinement layer 30, and first upper cladding layer 32 were changed as described later. Each thickness of other layers is fixed as follows:

| | |
|---|---|
| buffer layer 14: | 0.5 μm, |
| lower cladding layer 16: | 2.0 μm, |
| etch stop layer 34: | 3 nm, |
| second upper cladding layer 36: | 2.0 μm, |
| cap layer 38: | 0.5 μm. |

The thickness d1 of the first optical confinement layer 18 was adjusted to be equal to the thickness of the fourth optical confinement layer 30. The thickness d2 of the second optical confinement layer 20 was adjusted to be equal to the thickness of the third optical confinement layer 28. As shown in Table 1, d1 and d2 were set at different values in each combination of "a" to "i".

TABLE 1

| | a | b | c | d | e | f | g | h | i |
|---|---|---|---|---|---|---|---|---|---|
| d1 (nm) | 100 | 90 | 90 | 70 | 70 | 50 | 50 | 30 | 30 |
| d2 (nm) | 10 | 20 | 10 | 20 | 10 | 20 | 10 | 20 | 10 |

By combination of the various values for d1 and d2, the vertical width W ($W_v$) of the laser spot that results from the set of active layers can be varied. Those active layers include first and second optical confinement layers 18 and 20, first strained quantum-well layer 22, barrier layer 24, second strained quantum-well layer 26, and third and fourth optical confinement layers 28 and 30.

In addition, independently of the combination of the values for d1 and d2, the combined thickness "D" of the cladding layers formed between the top of the active layers and ridge cladding layer 36 was set at different values, as indicated in Table 2. For the structure shown in FIG. 4, these cladding layers include first upper cladding layer 32 and etch stop layer 36.

TABLE 2

| Thickness Setting | Thickness value D (μm) |
|---|---|
| 1 | 0.300 |
| 2 | 0.600 |
| 3 | 0.700 |
| 4 | 0.720 |
| 5 | 0.750 |
| 6 | 0.770 |
| 7 | 0.790 |
| 8 | 0.820 |
| 9 | 0.840 |
| 10 | 0.920 |
| 11 | 0.950 |
| 12 | 0.970 |
| 13 | 1.020 |
| 14 | 1.070 |
| 15 | 1.120 |

In our experiments, different combinations "a" to "i" of d1 and d2 from Table 1 were combined with different settings of combined thickness "D" from Table 2 to form a plurality of secondary combinations. These secondary combinations are indicated in Tables 3–6, where the letter of each secondary combination indicates the primary combination selected from Table 1, and where the number of each secondary combination indicates the thickness setting selected from Table 2. For example, the secondary combination a-6 was formed using the values of d1 and d2 from the primary combination "a" of Table 1, that is d1=100 nm and d2=10 nm, and using the thickness setting "6" from Table 2, D=770 nm=0.77 μm. After forming these secondary combinations, a plurality of laser diodes where constructed, with each laser diode having the thicknesses of its layers determined by the specifications of a corresponding secondary combination.

Each of the constructed lasers are tested to find the laser optical output power (in mW) at which the first significant kink in the laser output occurred. For the test, the current to the laser was gradually ramped up and the laser's optical power as a factor of the laser current was measured to determine the characteristic of the external differential quantum efficiency η. During the ramping of the current, η will reach a maximum value $\eta_{MAX}$ before encountering its first significant kink. We will define the kink output power level in these measurements to occur when the first of the following two events occurs:

1. when η first falls to a level which is at or below 80% of $\eta_{MAX}$ after $\eta_{MAX}$ is first reached, in which case the kink output power is the laser's output level at that point where η equals 80% of $\eta_{MAX}$;
2. when η undergoes an abrupt decrease of 20% or more, followed by a rebounding back to near its prior level, when the drive current is changed by a relatively small amount, in which case the kink output power is at the inflection point in η where it begins its rebound.

The results of the measurements for the kink output power levels for the secondary combinations are shown in Table 3 to Table 6, together with the value for D in the combination and the calculated value of D/W (D/W$_v$).

TABLE 3

| Combination | W(μm) | D(μm) | D/W | Kink output Power level (mW) | Evaluation |
|---|---|---|---|---|---|
| a-1 | 1.12 | 0.300 | 0.269 | 124 | NG |
| a-1 | 1.12 | 0.300 | 0.269 | 113 | NG |
| a-1 | 1.13 | 0.300 | 0.265 | 126 | NG |
| a-1 | 1.15 | 0.300 | 0.261 | 129 | NG |
| a-5 | 1.14 | 0.750 | 0.658 | 219 | G |
| a-6 | 1.13 | 0.770 | 0.682 | 205 | G |
| a-6 | 1.14 | 0.770 | 0.673 | 209 | G |
| b-1 | 1.16 | 0.300 | 0.259 | 124 | NG |
| b-1 | 1.17 | 0.300 | 0.257 | 106 | NG |
| b-1 | 1.17 | 0.300 | 0.256 | 122 | NG |
| b-1 | 1.17 | 0.300 | 0.256 | 131 | NG |
| b-1 | 1.18 | 0.300 | 0.255 | 121 | NG |
| b-1 | 1.20 | 0.300 | 0.250 | 112 | NG |
| b-6 | 1.16 | 0.770 | 0.663 | 242 | G |
| c-1 | 1.20 | 0.300 | 0.249 | 125 | NG |
| c-1 | 1.21 | 0.300 | 0.248 | 131 | NG |
| c-1 | 1.23 | 0.300 | 0.245 | 118 | NG |
| c-6 | 1.23 | 0.770 | 0.626 | 190 | G |
| c-6 | 1.24 | 0.770 | 0.622 | 195 | G |
| c-12 | 1.22 | 0.970 | 0.797 | 210 | G |
| c-12 | 1.25 | 0.970 | 0.777 | 296 | G |
| c-15 | 1.23 | 1.120 | 0.911 | 207 | G |
| c-15 | 1.24 | 1.120 | 0.901 | 280 | G |

TABLE 4

| Combination | W(μm) | D(μm) | D/W | Kink output Power level (mW) | Evaluation |
|---|---|---|---|---|---|
| d-4 | 1.28 | 0.720 | 0.564 | 191 | G |
| d-7 | 1.28 | 0.790 | 0.619 | 235 | G |
| d-7 | 1.28 | 0.790 | 0.619 | 226 | G |
| d-7 | 1.29 | 0.790 | 0.614 | 205 | G |
| d-7 | 1.29 | 0.790 | 0.612 | 208 | G |
| d-8 | 1.25 | 0.820 | 0.655 | 244 | G |
| d-12 | 1.28 | 0.970 | 0.757 | 296 | G |
| d-12 | 1.29 | 0.970 | 0.751 | 301 | G |
| d-12 | 1.30 | 0.970 | 0.749 | 254 | G |
| d-15 | 1.25 | 1.120 | 0.894 | 267 | G |
| d-15 | 1.27 | 1.120 | 0.884 | 254 | G |
| e-2 | 1.33 | 0.600 | 0.451 | 102 | NG |
| e-4 | 1.32 | 0.720 | 0.547 | 204 | G |
| e-7 | 1.33 | 0.790 | 0.594 | 196 | G |
| e-8 | 1.31 | 0.820 | 0.628 | 191 | G |
| e-9 | 1.31 | 0.840 | 0.643 | 283 | G |
| e-9 | 1.32 | 0.840 | 0.638 | 245 | G |
| e-10 | 1.33 | 0.920 | 0.691 | 207 | G |
| e-12 | 1.31 | 0.970 | 0.743 | 243 | G |
| e-12 | 1.32 | 0.970 | 0.737 | 203 | G |
| e-13 | 1.34 | 1.020 | 0.761 | 269 | G |
| e-16 | 1.32 | 1.130 | 0.856 | 345 | G |

TABLE 5

| Combination | W(μm) | D(μm) | D/W | Kink output Power level (mW) | Evaluation |
|---|---|---|---|---|---|
| f-2 | 1.35 | 0.600 | 0.444 | 138 | NG |
| f-2 | 1.36 | 0.600 | 0.440 | 131 | NG |
| f-2 | 1.36 | 0.600 | 0.440 | 118 | NG |
| f-9 | 1.35 | 0.840 | 0.621 | 252 | G |
| f-9 | 1.37 | 0.840 | 0.612 | 234 | G |
| f-10 | 1.39 | 0.920 | 0.660 | 202 | G |
| f-12 | 1.36 | 0.970 | 0.715 | 197 | G |
| f-12 | 1.36 | 0.970 | 0.715 | 194 | G |
| f-13 | 1.39 | 1.020 | 0.731 | 195 | G |
| f-14 | 1.35 | 1.070 | 0.792 | 261 | G |
| f-14 | 1.36 | 1.070 | 0.785 | 296 | G |
| f-14 | 1.41 | 1.070 | 0.761 | 209 | G |
| f-15 | 1.36 | 1.120 | 0.822 | 271 | G |
| g-2 | 1.42 | 0.600 | 0.422 | 142 | NG |
| g-3 | 1.45 | 0.700 | 0.484 | 143 | NG |
| g-10 | 1.45 | 0.920 | 0.636 | 238 | G |
| g-11 | 1.45 | 0.950 | 0.657 | 254 | G |
| g-12 | 1.42 | 0.970 | 0.684 | 298 | G |
| g-13 | 1.42 | 1.020 | 0.720 | 302 | G |
| g-13 | 1.44 | 1.020 | 0.708 | 218 | G |
| g-13 | 1.42 | 1.030 | 0.724 | 256 | G |
| g-14 | 1.41 | 1.070 | 0.758 | 226 | G |

TABLE 6

| Combination | W(μm) | D(μm) | D/W | Kink output Power level (mW) | Evaluation |
|---|---|---|---|---|---|
| h-3 | 1.49 | 0.700 | 0.470 | 167 | NG |
| h-13 | 1.46 | 1.020 | 0.697 | 215 | G |
| i-3 | 1.52 | 0.700 | 0.461 | 158 | NG |
| i-3 | 1.53 | 0.700 | 0.457 | 127 | NG |
| i-6 | 1.50 | 0.770 | 0.513 | 235 | G |

A kink output power level of at least 200 mW is desired in a practical GaAs-based quantum-well laser diode. In Tables 3–6, each secondary combination which produces a laser diode having a kink output power of 200 mW or more is evaluated as passing (G), each combination which produces a laser diode having a kink output power of less than 200 mW is evaluated as failing (NG).

From the above results, when D/W≧0.5, the evaluation is "G". A practical GaAs-based quantum well laser diode having a high output power is achievable by having a relationship D/W≧0.5.

The critical meaning of the configuration that the thickness D is equal to or larger than a half the vertical spot width W (i.e., D/W≧0.5) is further detailed.

FIG. 5 shows the relationship between the kink output power and the ratio D/W, wherein the kink output powers (mW) tabulated in Tables 3 and 6 are plotted on the abscissa, and the ratios D/W tabulated on Tables 3 and 6 are plotted on ordinate. As seen from FIG. 5, in the range where D/W≧0.5, the kink output power is above 190 mW or substantially above 200 mW, which is sufficient for the semiconductor laser diode, whereas in the range where D/W<0.5, the kink output power is below about 170 mW, or more accurately, below 167 mW. That is, a clear difference as high as 20 mW appears in the kink output power between the former range and the latter range. The difference is technically significant for the characteristics of the ridge waveguide semiconductor laser diode, and thus the ratio D/W=0.5 has a critical meaning therein.

Further studies revealed that there is a preferred upper limit for the ratio D/W. In the experiments conducted, a larger remaining thickness "D" resulted in a reduction in the difference Δn between the effective refractive index $n_M$ of the mesa structure and the effective refractive index $n_R$ of the remaining cladding layer (Δn=$n_M$−$n_R$). The effect of the remaining thickness D upon Δη is shown in FIG. 6. A larger remaining thickness D above a threshold value intensified the gain guide mode in the mesa structure, which reduced the mode control effect (stability) of the mechanism in the waveguide that stabilizes the fundamental transverse mode, and in turn induced a kink phenomenon along with a reduction in the stability of the fundamental transverse mode. As a result, a beam-steering effect occurs in the far field pattern (FFP) whereby the center of the laser spot in the FFP shifts horizontally along the X-axis and away from the center axis defined by the laser cavity (e.g., the Z-axis) during operation or when the drive current is varied through the laser's current range. The horizontal shift is called a fluctuation. In addition, there may be some spurious side humps or minor side peaks which occur in the FFP, the latter of which normally has a Gaussian-like shape. A side hump in the FFP is also call a fluctuation. FIG. 7 shows the FFP patterns of a prior art device along the horizontal axis (Y-axis) at selected drive current levels (200 mA, 300 mA, 400 mA, and 440 mA) which produce corresponding optical output power levels in the laser. The FFP patterns for 200 mA and 300 mA are normal and have a Gaussian-like shape. However, the FFP pattern for 400 mA has a side hump, and the FFP pattern for 440 mA has multiple side humps and its peak is shifted about-3 degrees from the peak positions of the other FFP patterns. We define a stable (fundamental) transverse mode as a state in which, during the operation of the laser and as the laser's current is varied through the laser's operating range, the peak stays within 1 degree of its center value. We define an unstable (fundamental) mode as a state in which the beam peak shifts by more than 1 degree in the FFP during the operation of the laser or as the laser's current is varied through the laser's operating range.

The studies further revealed that the unstable fundamental transverse mode due to the larger remaining thickness D caused an unstable longitudinal mode in the lasing wavelength of the ridge waveguide semiconductor laser diode, and thus caused the optical output power to fluctuate when a FBG was positioned in front of the front facet of the semiconductor laser diode. We define a "stable longitudinal mode" as a state where the lasing wavelength of the laser is relatively fixed at a single wavelength, and an "unstable longitudinal mode" as a state where the lasing wavelength changes between a single wavelength and multiple wavelength values during the operation of the laser. The studies revealed that the relationship $D/W \geq 0.5$ is not sufficient for achieving the need for a high degree of stability in the longitudinal and transverse modes of the laser output when operating the laser in a higher output power range. Without finding the upper limit of the ratio D/W, it is difficult to provide a ridge waveguide semiconductor laser diode having a higher desired output power for the development of WDM systems, or provide a ridge waveguide laser diode for use as a light source for an optical module.

In view of the above, the present inventors conducted further studies to find the preferred upper limit of the ratio D/W with the following experiments.

In the experiments, samples for the semiconductor laser diodes each having the remaining thickness D and width W tabulated in Tables 7 and 8 were fabricated, operated for a higher optical output power, and evaluated in connection with the fluctuations in the far-field pattern (FFP).

In the evaluation, samples exhibiting a larger fluctuation in the FFP (greater than 1 degree), which generally causes a lower stability, were judged as failing devices, whereas samples exhibiting a lower fluctuation in the FFP (1 degree or less), which generally results in relatively higher stability in the transverse mode, were judged as passing devices. The results of the evaluation is shown in Tables 7 and 8.

TABLE 7

| Sample No. | W ($\mu$m) | D ($\mu$m) | D/W | Evaluation |
|---|---|---|---|---|
| 1 | 1.26 | 0.98 | 0.78 | G |
| 2 | 1.26 | 1.13 | 0.90 | G |
| 3 | 1.16 | 1.02 | 0.88 | G |
| 4 | 1.30 | 1.46 | 1.12 | NG |
| 5 | 1.34 | 0.97 | 0.72 | G |
| 6 | 1.43 | 0.96 | 0.67 | G |
| 7 | 1.46 | 1.23 | 0.84 | G |
| 8 | 1.30 | 1.01 | 0.78 | G |
| 9 | 1.27 | 0.99 | 0.78 | G |
| 10 | 1.47 | 0.79 | 0.54 | G |
| 11 | 1.65 | 1.52 | 0.92 | G |
| 12 | 1.56 | 1.62 | 1.04 | G |
| 13 | 1.29 | 1.78 | 1.38 | NG |
| 14 | 1.27 | 1.68 | 1.32 | NG |
| 15 | 1.60 | 1.4 | 0.88 | G |
| 16 | 1.64 | 1.52 | 1.06 | G |
| 17 | 1.40 | 1.64 | 1.17 | NG |
| 18 | 1.28 | 1.64 | 1.28 | NG |
| 19 | 1.45 | 1.58 | 1.09 | NG |
| 20 | 1.34 | 1.48 | 1.10 | NG |
| 21 | 1.47 | 1.95 | 1.33 | NG |
| 22 | 1.57 | 1.59 | 1.01 | G |
| 23 | 1.48 | 1.41 | 0.95 | G |
| 24 | 1.51 | 1.55 | 1.03 | G |
| 25 | 1.63 | 1.73 | 1.06 | NG |

TABLE 8

| Sample No. | W ($\mu$m) | D ($\mu$m) | D/W | Evaluation |
|---|---|---|---|---|
| 26 | 1.79 | 1.65 | 0.92 | G |
| 27 | 1.42 | 1.61 | 1.13 | NG |
| 28 | 1.48 | 1.56 | 1.05 | G |
| 29 | 1.77 | 1.94 | 1.10 | NG |
| 30 | 1.60 | 1.28 | 0.80 | G |
| 31 | 1.44 | 1.17 | 0.81 | G |
| 32 | 1.78 | 1.35 | 0.76 | G |
| 33 | 1.64 | 1.67 | 1.02 | G |
| 34 | 1.50 | 1.84 | 1.23 | NG |
| 35 | 1.62 | 1.54 | 0.95 | G |
| 36 | 1.48 | 1.47 | 0.99 | G |
| 37 | 1.85 | 1.95 | 1.05 | G |
| 38 | 1.63 | 1.76 | 1.08 | NG |
| 39 | 1.51 | 1.2 | 0.79 | G |
| 40 | 1.99 | 1.36 | 0.68 | G |
| 41 | 1.74 | 1.33 | 0.76 | G |
| 42 | 1.62 | 1.5 | 0.93 | G |
| 43 | 1.68 | 1.58 | 0.94 | G |
| 44 | 1.72 | 1.44 | 0.84 | G |
| 45 | 1.85 | 1.83 | 0.99 | NG |
| 46 | 1.63 | 1.35 | 0.83 | G |
| 47 | 1.67 | 1.43 | 0.86 | G |
| 48 | 1.64 | 1.24 | 0.76 | G |
| 49 | 1.54 | 1.11 | 0.72 | G |
| 50 | 1.72 | 1.57 | 0.91 | G |

As a seen from Tables 7 and 8, except for some minor variations, the ratio D/W=1 to D/W=1.1 exhibits a critical significance, wherein the judgement is "NG", or failing, for the range D/W>1.1, and the judgement is "G", or passing, for the range D/W<1, with many judgements being passing in the range of D/W=1.0 to D/W=1.1. The results of Tables 7 and 8 are plotted in FIG. 9. FIG. 8 shows the far-field patterns of a device constructed according to the present invention at the same current levels used in the prior art example of FIG. 7.

Based on the findings as detailed above, a ridge waveguide semiconductor laser diode according to the present invention has a structure which satisfies:

$$1.10 > D/W \geq 0.5$$

and more preferably satisfies:

$$1.05 > D/W > 0.5$$

and most preferably satisfies:

$$1.0 > D/W \geq 0.5$$

for the remaining thickness D of the cladding layer formed on the active layer or layers, and for the vertical spot width W providing an intensity $1/e_{+hu\ 2}$ for the near-field pattern in the vertical direction or the direction normal to the active layer. Combined data from the experiments according to the present invention are plotted in FIG. 10, where the result of a constructed laser is plotted with a diamond symbol for a laser with a stable high kink output power and an "x" symbol for a laser with an unstable transverse mode, an unstable longitudinal mode, and/or a low kink output power level. Each shown laser is plotted along the abscissa according to laser's W value, and along the ordinate according to the laser's D value.

The cladding layer may be an upper cladding layer or a layer having a similar function and formed over the entire surface of the active layer or layers.

The present invention is applicable to any ridge waveguide semiconductor laser diode such as In-or GaN-based laser diodes in addition to the GaAs-based semiconductor laser diodes. It is also applicable to such a laser diode irrespective whether or not the active layer has a quantum well structure.

The present invention is suitably applicable to such a laser diode irrespective of the width of the mesa structure of the ridge waveguide. However, the present invention is preferably applied to a ridge waveguide semiconductor laser diode having a mesa structure which is 4 μm wide or more (S≧4 μm).

Now, the present invention is more specifically described with reference to accompanying drawings, wherein similar constituent elements are designated by similar reference numerals throughout the drawings.

Referring to FIG. 4, a ridge waveguide semiconductor laser diode, generally designated by numeral 40, according to a first embodiment of the present invention has a layer structure similar to the layer structure of the semiconductor laser 10 shown in FIG. 1 except that the overall remaining thickness D in the present embodiment, which is defined by the sum of thicknesses of the layers including the first upper cladding layer 32 and the etch stop layer 34, satisfies the following relationship:

$$1.10 > D/W > 0.5.$$

The contents of the layers in the present embodiment are similar to those of the samples used in the first and second experiments.

More specifically, the laser diode 40 of FIG. 4 has a n-type GaAs substrate 12, and a layer structure grown thereon and including:

| | |
|---|---|
| n-GaAs | buffer layer 14; |
| n-Al$_{0.3}$Ga$_{0.7}$As | lower cladding layer 16; |
| Al$_{0.2}$Ga$_{0.8}$As | first optical confinement layer 18; |
| GaAs$_{0.94}$P$_{0.06}$ | second optical confinement layer 20; |
| In$_{0.2}$Ga$_{0.8}$As | first strained quantum well layer 22; |
| GaAs$_{0.94}$P$_{0.06}$ | barrier layer 24; |
| In$_{0.2}$Ga$_{0.8}$As | second strained quantum well layer 26; |
| GaAs$_{0.94}$P$_{0.06}$ | third optical confinement layer 28; |

-continued

| | |
|---|---|
| Al$_{0.2}$Ga$_{0.5}$As | fourth optical confinement layer 30; |
| p-Al$_{0.3}$Ga$_{0.7}$As | first upper cladding layer 32; |
| p-In$_{0.5}$Ga$_{0.5}$P | etch stop layer 34; |
| p-Al$_{0.3}$Ga$_{0.7}$As | second upper cladding layer 36; and |
| p-GaAs | cap layer 38. |

The thicknesses of the first optical confinement layer 18, second optical confinement layer 20, third optical confinement layer 28, fourth optical confinement layer 30 and first upper cladding layer 32 are determined as detailed later. The thicknesses of the remaining layers are as follows:

| | |
|---|---|
| buffer layer 14: | 0.5 μm, |
| lower cladding layer 16: | 2.0 μm, |
| etch stop layer 34: | 3 nm, |
| Second upper cladding layer 36: | 2.0 μm, |
| cap layer 38: | 0.5 μm. |

By employing the configuration wherein the first optical confinement layer 18 and the fourth optical confinement layer 30 have the same thickness d1, and the second optical confinement layer 20 and the third optical confinement layer 28 have the same thickness d2, with d1 and d2 being changed for obtaining a variety of combinations of thicknesses, the vertical spot width W (W$_v$) at the laser front facet that results from the set of active layers can be varied. Those active layers include first and second optical confinement layers 18 and 20, first strained quantum well layer 22, barrier layer 24, second strained quantum well layer 26, and third and fourth optical confinement layers 28 and 30.

The width S of the mesa structure for the above layer diode is set at 4 μm.

A laser diode device according to the present invention may be constructed in the following manner. As a first step, a desired value for the vertical spot width W (W$_v$) is selected based on the needs of the application that the laser will be used in, or on other criterion important to the user. Oftentimes, the user will want the vertical divergence angle θ$_v$ of the laser beam to be within a selected range of values, and the user may use the above equation [1] to selected a value of W based on a desired value of θ$_v$. Based on the selected value of W, the user can then consult Tables 3–6 to find thickness values d1 and d2 of the optical confinement layers which provide values of W near or at the selected value of W, or the user may construct his own matrix of devices which have different thicknesses of the active layers and different values of D to find a range of constructions to select from to achieve a desired value of W. Finally, the value of the remaining thickness D may then be selected within the range of 1.10>D/W≧0.5, which is equivalent to 1.10×W≧D≧0.5×W, or within the more preferred range of W>D≧0.5×W. As an example, when the desired spot size width "W" is 1.3 μm, the value for "D" is selected such that 1.43 μm>D≧0.65 μm for the larger range, that is, D is equal to or greater than 0.65 μm and less than 1.43 μm, and is selected such that 1.33 μm>D≧0.65 μm for the most preferred range. More specifically, the thicknesses of first upper cladding layer 32 and the etch stop layer 34 are selected so that the remaining thickness D is lower than 1.43 μm, but is not lower than 0.65 μm for the larger range; and are selected so that the remaining thickness D is lower than 1.33 μm, but is not lower than 0.65 μm for the most preferred range.

The remaining thickness "D" in FIG. 4 is defined by the sum of thicknesses of the layers disposed between fourth optical confinement layer 30 and the mesa structure, that is, layers including first upper cladding layer 32, etch stop layer 34, and any additional layers that the user may add between fourth optical confinement layer 30 and the mesa structure, with the additional layers functioning as cladding material with respect to the optical confinement layers and/or the active layers.

In the present embodiment, although the etch stop layer 34 made of $In_{0.5}Ga_{0.5}P$ is used for controlling the remaining thickness "D" of the cladding layer remaining above the active layers, it is possible to control the remaining thickness "D" by using another etch stop layer or another method instead of using an etch stop layer, and thus the presence of etch stop layer 34 is not necessary for practicing the present invention.

As described above, the ridge waveguide semiconductor laser diode of the present embodiment has an excellent linear relationship between the optical output power and the injected current due to the relationship $D/W \geq 0.5$, and operates with excellent stability in both the transverse and longitudinal modes at a higher optical output power due to the relationship $1.10 > D/W$.

Since the above embodiments are described only for examples, the present invention is not limited to the above embodiments and various modifications or alterations can be easily made therefrom by those skilled in the art without departing from the scope of the present invention.

What is claimed is:

1. A ridge waveguide semiconductor laser diode comprising:
    a semiconductor substrate,
    a front facet and a back facet;
    at least one active layer disposed over said semiconductor substrate and disposed between said front and back facets, said at least one active layer having a surface, and
    at least one cladding layer disposed over said at least one active layer and disposed between said front and back facets and having a ridge structure part and an underlying remaining part, said remaining part overlying substantially an entire surface of said active layer and having a thickness D, and
    wherein the laser diode emits a beam of light from its front facet when operated, the beam having a maximum power level substantially at its center and a peripheral edge where the power level of the beam is a fraction $1/e^{+hu\ 2}$ of the maximum power level, wherein "e" is the base of the natural logarithm, the peripheral edge of the beam having a vertical width W as measured at the front facet and in a direction which is perpendicular to the surface of the at least one active layer, and
    wherein said thickness D has a value in the range of: $1.1 \times W > D \geq W \times 0.5$.

2. The ridge waveguide semiconductor laser diode according to claim 1, wherein said active layer comprises a GaAs-based layer.

3. The ridge waveguide semiconductor laser diode as defined in claim 1, wherein said at least one cladding layer further comprises an etch stop layer between said ridge structure part and said remaining part.

4. The ridge waveguide semiconductor laser diode as defined in claim 1, wherein said thickness D has a value in the range of: $1.05 \times W > D \geq W \times 0.5$.

5. The ridge waveguide semiconductor laser diode as defined in claim 1, wherein said thickness D has a value in the range of: $W > D \geq W \times 0.5$.

6. A ridge waveguide semiconductor laser diode comprising:
    a semiconductor substrate,
    a front facet and a back facet;
    at least one active layer disposed over said semiconductor substrate and disposed between said front and back facets, said at least one active layer having a surface, and
    at least one cladding layer disposed over said at least one active layer and disposed between said front and back facets and having a ridge structure part and an underlying remaining part, said remaining part overlying said at least one active layer and having a thickness D, and
    wherein the laser diode emits a beam of light from its front facet when operated, the beam having a maximum power level substantially at its center and a peripheral edge where the power level of the beam is a fraction $1/e^{+hu\ 2}$ of the maximum power level, wherein "e" is the base of the natural logarithm, the peripheral edge of the beam having a vertical width W as measured at the front facet and in a direction which is perpendicular to the surface of the at least one active layer, and
    wherein said thickness D has a value in the range of: $1.1 \times W > D \geq 0.5 \times W$.

7. The ridge waveguide semiconductor laser diode according to claim 6, wherein said active layer comprises a GaAs-based layer.

8. The ridge waveguide semiconductor laser diode according to claim 6, wherein said at least one cladding layer further comprises an etch stop layer between said ridge structure part and said remaining part.

9. The ridge waveguide semiconductor laser diode according to claim 6, wherein said remaining part overlies substantially the entire surface of said at least one active layer.

10. The ridge waveguide semiconductor laser diode according to claim 6, wherein the peripheral edge of the beam emitted by the laser diode has a horizontal width $W_H$ as measured at the front facet and in a direction which is parellel to the surface of the at least one active layer;
    wherein the ridge structure part has a first ridge side disposed between said front and back facets, a second ridge side disposed between said front and back facets, and a width S between said first and second ridge sides, and
    wherein said remaining part has a first portion underlying said ridge structure part, a second portion which extends away from the ridge structure part by a distance of at least $2 \times W_H$ from the first ridge side, and a third portion which extends away from the ridge structure part by a distance of at least $2 \times W_H$ from the second ridge side.

11. The ridge waveguide semiconductor laser diode as defined in claim 6, wherein said thickness D has a value in the range of: $1.05 \times W > D \geq W \times 0.5$.

12. The ridge waveguide semiconductor laser diode as defined in claim 6, wherein said thickness D has a value in the range of: $W > D \geq W \times 0.5$.

13. A ridge waveguide semiconductor laser diode comprising:
    a semiconductor substrate;
    a front facet and a back facet;
    at least one active layer disposed over said semiconductor substrate and disposed between said front and back facets, said at least one active layer having a surface; and at least one cladding layer disposed over said at least one active layer and disposed between said front and back facets and having a ridge structure part disposed over an underlying remaining part, said remaining part overlying said at least one active layer and having a thickness D; and wherein the laser diode emits a beam of light of wavelength λ from its front facet when operated, the beam generating a far-field pattern which comprises an oval shape, the far-field pattern having a maximum power level substantially at the center of the oval shape and a peripheral edge around the center where the power level of the far-field pattern is one-half of the maximum power level, the peripheral edge having a vertical width in a direction which is perpendicular to the surface of said at least one active layer, the vertical width having two distal ends, the beam further having a fall angle $\theta_V$ defined between the front facet and the two distal ends of the vertical width; and wherein said thickness D has a value in the range of: $1.1 \times W > D \geq 0.5 \times W$, where W is related to $\theta_V$ by a relationship equivalent to:

$$W = \frac{\lambda}{\pi \cdot \tan\left(\frac{\theta_V}{\sqrt{2 \cdot \ln 2}}\right)},$$

where $\theta_V$ is provided in the dimensions of radians, where "ln 2" is the natural logarithm of 2, and where "tan" is the tangent function.

14. The ridge waveguide semiconductor laser diode according to claim 13, wherein said active layer comprises a GaAs-based layer.

15. The ridge waveguide semiconductor laser diode according to claim 13, wherein said at least one cladding layer further comprises an etch stop layer between said ridge structure part and said remaining part.

16. The ridge waveguide semiconductor laser diode according to claim 13, wherein said remaining part overlies substantially the entire surface of said at least one active layer.

17. The ridge waveguide semiconductor laser diode according to claim 13, the peripheral edge of the far-field pattern further has a horizontal width in a direction which is parallel to the surface of said at least one active layer, the horizontal width having two distal ends, the beam further having a full angle $\theta_H$ defined between the front facet and the two distal ends of the horizontal width, wherein a corresponding width $W_H$ at the facet can be estimated in a form equivalent to:

$$W_H = \frac{\lambda}{\pi \cdot \tan\left(\frac{\theta_H}{\sqrt{2 \cdot \ln 2}}\right)},$$

where $\theta_H$ is provided in the dimensions of radians, where "ln 2" is the natural logarithm of 2, and where "tan" is the tangent function;

wherein the ridge structure part has a first ridge side disposed between said front and back facets, a second ridge side disposed between said front and back facets, and a width S between said first and second ridge sides, and wherein said remaining part has a first portion underlying said ridge structure part, a second portion which extends away from the ridge structure part by a distance of at least $2 \times W_H$ from the first ridge side, and a third portion which extends away from the ridge structure part by a distance of at least $2 \times W_H$ from the second ridge side.

18. The ridge waveguide semiconductor laser diode as defined in claim 13, wherein said thickness D has a value in the range of: $1.05 \times W > D \geq W \times 0.5$.

19. The ridge waveguide semiconductor laser diode as defined in claim 13, wherein said thickness D has a value in the range of: $W > D \geq W \times 0.5$.

* * * * *